(12) United States Patent
Owaki

(10) Patent No.: US 10,904,999 B2
(45) Date of Patent: Jan. 26, 2021

(54) ELECTRONIC APPARATUS, CAMERA APPARATUS, AND SHIELD CHASSIS

(71) Applicant: SONY SEMICONDUCTOR SOLUTIONS CORPORATION, Kanagawa (JP)

(72) Inventor: Hirofumi Owaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 70 days.

(21) Appl. No.: 16/322,314

(22) PCT Filed: Jul. 25, 2017

(86) PCT No.: PCT/JP2017/026859
§ 371 (c)(1),
(2) Date: Jan. 31, 2019

(87) PCT Pub. No.: WO2018/047491
PCT Pub. Date: Mar. 15, 2018

(65) Prior Publication Data
US 2019/0174623 A1    Jun. 6, 2019

(30) Foreign Application Priority Data
Sep. 6, 2016    (JP) ................................. 2016-173298

(51) Int. Cl.
*H05K 1/02*    (2006.01)
*G03B 17/02*    (2006.01)
(Continued)

(52) U.S. Cl.
CPC ........... *H05K 1/0259* (2013.01); *G03B 17/02* (2013.01); *H04N 5/225* (2013.01); *H04N 5/2252* (2013.01);
(Continued)

(58) Field of Classification Search
CPC .... H04N 5/225; H04N 5/5223; H04N 5/5224; H05K 1/14; H05K 1/141; H05K 1/181–188
(Continued)

(56) References Cited

U.S. PATENT DOCUMENTS 7,126,101 B2 * 10/2006 Yamaguchi ........ G02B 23/2453
250/208.1
7,965,336 B2 * 6/2011 Bingle ..................... B60R 1/04
348/374
(Continued)

FOREIGN PATENT DOCUMENTS

| JP | H10-163671 A | 6/1998 |
|---|---|---|
| JP | 2011-166012 A | 8/2011 |
| JP | 5413231 B2 | 2/2014 |

OTHER PUBLICATIONS

Aug. 5, 2019, European Search Report issued for related EP Application No. 17848436.6.
(Continued)

*Primary Examiner* — Tuan T Dinh
(74) *Attorney, Agent, or Firm* — Paratus Law Group, PLLC

(57) ABSTRACT

To provide an electronic apparatus, a camera apparatus, and a shield chassis to be installed in a vehicle and used, whose ground is reinforced. A flexible printed circuit includes an FPC extension portion which is a ground pattern portion extended from a terminal portion for electrically connecting to on the side of the board. On the other hand, a clip portion whose cross-section has an approximately C-shape and whose upper surface includes an opening formed therein is formed at an upper end edge of one wall surface of a shield chassis. A tongue portion of the FPC extension portion,
(Continued)

which is inserted through the opening, is sandwiched by the clip portion, such that the FPC extension portion is fixed to the shield chassis.

11 Claims, 18 Drawing Sheets

(51) Int. Cl.
    *H04N 5/225*     (2006.01)
    *H05K 9/00*     (2006.01)
    *H05K 7/14*     (2006.01)

(52) U.S. Cl.
    CPC ....... *H04N 5/2253* (2013.01); *H04N 5/22521* (2018.08); *H05K 1/0215* (2013.01); *H05K 1/0281* (2013.01); *H05K 7/1417* (2013.01); *H05K 9/0058* (2013.01); *H05K 2201/10121* (2013.01)

(58) Field of Classification Search
    USPC ........ 361/749–750, 752, 807–810, 816, 818; 348/65, 92, 340, 373–375; 174/250–254
    See application file for complete search history.

(56) References Cited

U.S. PATENT DOCUMENTS

| | | | |
|---|---|---|---|
| 8,427,572 B2 * | 4/2013 | Higashiyama | G03B 17/02 348/340 |
| 9,396,633 B1 * | 7/2016 | Sannala | G08B 13/19619 |
| 9,621,769 B2 * | 4/2017 | Mai | H04N 5/2252 |
| 2010/0283890 A1 * | 11/2010 | Mizumura | H04N 5/2253 348/374 |
| 2012/0218466 A1 | 8/2012 | Higashiyama et al. | |
| 2013/0271588 A1 * | 10/2013 | Kirma | A61B 1/00177 348/76 |
| 2015/0237240 A1 * | 8/2015 | Park | H04N 5/2253 348/374 |
| 2015/0327398 A1 * | 11/2015 | Achenbach | B60R 1/00 348/148 |
| 2018/0072239 A1 * | 3/2018 | Wienecke | H04N 5/2253 |

OTHER PUBLICATIONS

Apr. 28, 2020, Chinese Office Action issued for related CN application No. 201780052661.0.

* cited by examiner

US 10,904,999 B2

ELECTRONIC APPARATUS, CAMERA APPARATUS, AND SHIELD CHASSIS

CROSS REFERENCE TO PRIOR APPLICATION

This application is a National Stage Patent Application of PCT International Patent Application No. PCT/JP2017/026859 (filed on Jul. 25, 2017) under 35 U.S.C. § 371, which claims priority to Japanese Patent Application No. 2016-173298 (filed on Sep. 6, 2016), which are all hereby incorporated by reference in their entirety.

TECHNICAL FIELD

The technology disclosed in the present specification relates to an electronic apparatus, a camera apparatus, and a shield chassis to be installed in a vehicle and used.

BACKGROUND ART

Recently, more and more automobiles install a camera. An image photographed by a vehicle-mounted camera can be presented to a driver and other passengers on a monitor screen in a vehicle interior, for example, and can be recorded on a dashcam. Further, driving assistance and visual field support can be performed on the basis of results obtained by applying image processing such as image recognition on images photographed by the vehicle-mounted camera and detecting road white lines (lanes), traffic signals, traffic signs, and oncoming vehicles, pedestrians around its own vehicle, and the like.

More strict requirements of measures of electro-static discharge (ESD) and electro-magnetic compatibility (EMC) are imposed on vehicle-mounted cameras as compared to products for general consumers such as digital cameras. It is essential to reinforce a ground (GND). When the vehicle-mounted camera emits noise, it also adversely affects a television antenna, a GPS antenna, and the like. Further, constraints related to the size of the vehicle-mounted camera are also severe.

For example, in general, a metal shield chassis is provided inside a housing (casing) of the vehicle-mounted camera, a circumference of a printed wiring board on which circuit components and the like are mounted is covered with this shield chassis for reducing influences of unwanted electro-magnetic radiation.

In addition, the ground of the printed wiring board can be reinforced by electrically connecting a ground pattern of the printed wiring board to the shield chassis. For example, proposition has been made relating to an electronic apparatus and a camera apparatus which are capable of stably maintaining electrical connection between the ground pattern and the shield chassis even in an environment where vibration frequently occurs, like a vehicle, by fixing a leading end of the flexible printed circuit electrically connected to the ground pattern of the printed wiring board to a connection piece formed on the side of the shield chassis by use of a clip member (e.g., see Patent Literature 1).

CITATION LIST

Patent Literature

Patent Literature 1: Japanese Patent No. 5413231

Disclosure of Invention

Technical Problem

It is an object of the technology disclosed in the present specification to provide an electronic apparatus, a camera apparatus, and a shield chassis to be installed is a vehicle and used, whose ground is reinforced.

Solution to Problem

The technology disclosed in the present specification has been made in view of the above-mentioned problem. A first aspect thereof is an electronic apparatus including:

a board provided inside a housing and including a circuit component mounted on the board;

a shield chassis that covers a circumference of the board; and a flexible printed circuit that electrically connects the board and the shield chassis to each other, in which the shield chassis includes a sandwiching portion that sandwiches the flexible printed circuit, the sandwiching portion being formed integrally with the shield chassis.

In accordance with a second aspect of the technology disclosed in the present specification, the flexible printed circuit of the electronic apparatus according to the first aspect includes a signal line pattern portion that electrically connects to a ground pattern portion of the board, and the sandwiching portion is configured to sandwich the flexible printed circuit to be held in contact with the signal line pattern portion.

In accordance with a third aspect of the technology disclosed in the present specification, the sandwiching portion of the electronic apparatus according to the first aspect includes a clip portion formed by bending a projection formed at an upper end edge of a wall surface of the shield chassis and is configured to sandwich the flexible printed circuit by use of the clip portion.

In accordance with a fourth aspect of the technology disclosed in the present specification, the clip portion of the electronic apparatus according to the third aspect includes an opening in an upper surface and is configured to sandwich an end portion of the flexible printed circuit inserted through the opening.

In accordance with a fifth aspect of the technology disclosed in the present specification, the flexible printed circuit of the electronic apparatus according to the fourth aspect includes a tongue portion smaller than a width of the opening provided protruding from an expanded portion larger than the width of the opening and is configured to be sandwiched by the clip portion in such a manner that the tongue portion is inserted through the opening.

In accordance with a sixth aspect of the technology disclosed in the present specification, the tongue portion of the electronic apparatus according to the fifth aspect is formed to be longer than the clip portion.

In accordance with a seventh aspect of the technology disclosed in the present specification, the electronic apparatus according to the fourth aspect further includes a reinforcing plate superimposed on a vicinity of the end portion of the flexible board. Further, the clip portion is configured to sandwich the end portion of the flexible printed circuit together with the reinforcing plate.

In accordance with an eighth aspect of the technology disclosed in the present specification, the opening of the electronic apparatus according to the fourth aspect has a stepped structure in which an end edge on a root side (a side closer to the wall surface of the shield chassis) is formed to be higher than an end edge on a side closer to a leading end of the clip portion.

In accordance with a ninth aspect of the technology disclosed in the present specification, in the electronic apparatus according to the seventh aspect, a distance from a point of contact between the clip portion and the flexible printed circuit to a lower end of the reinforcing plate is configured to be larger than a clearance between an upper end of the reinforcing plate and an inner wall of the housing.

In accordance with a tenth aspect of the technology disclosed in the present specification, in the electronic apparatus according to the fifth aspect, a difference between the width of the opening and a width of the tongue portion is configured to be smaller than a gap between an end edge of the tongue portion and an end edge of the expanded portion.

Further, an eleventh aspect of the technology disclosed in the present specification is a camera apparatus including:

a shield chassis that covers a circumference of the board; and a flexible printed circuit that electrically connects the board and the shield chassis to each other, in which the shield chassis includes a sandwiching portion that sandwiches the flexible printed circuit, the sandwiching portion being formed integrally with the shield chassis.

Further, a twelfth aspect of the technology disclosed in the present specification is a shield chassis that covers a circumference of a board inside an electronic apparatus and includes a sandwiching portion that sandwiches a flexible printed circuit connected to the board, the sandwiching portion being formed integrally with the shield chassis.

Advantageous Effects of Invention

In accordance with the technology disclosed in the present specification, it is possible to provide an electronic apparatus, a camera apparatus, and a shield chassis to be installed in a vehicle and used, whose ground is reinforced.

It should be noted that effects set forth herein are merely exemplary and effects of the present invention are not limited thereto. Further, the present invention may exert further additional effects other than the above-mentioned effects.

Additional other objects, characteristics, and advantages of the technology disclosed in the present specification will be clear through a more detailed description based on an embodiment to be described later and the accompanying drawings.

MODE(S) FOR CARRYING OUT THE INVENTION

Hereinafter, an embodiment of the technology disclosed in the present specification will be described in detail with reference to the drawings.

Figure 1:
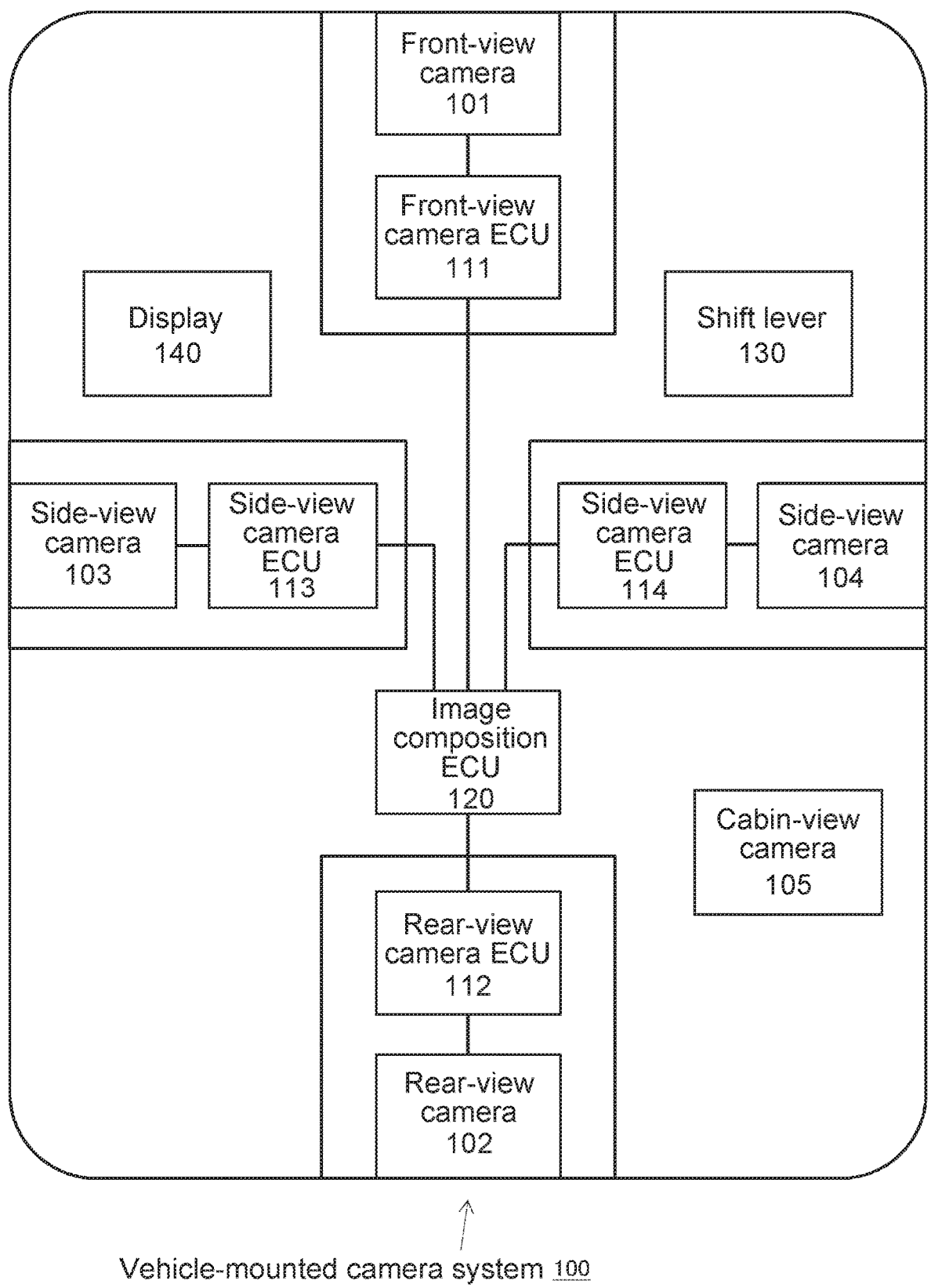
FIG. 1 is a diagram showing a configuration example of a vehicle-mounted camera system 100.

FIG. 1 schematically shows a configuration example of a vehicle-mounted camera system 100 to be installed in a vehicle. The vehicle-mounted camera system 100 shown in the figure includes a total of four vehicle-mounted cameras which are a front-view camera 101, a rear-view camera 102, respective left and right side-view cameras 103 and 104. It should be noted that the number of vehicle-mounted cameras does not necessarily need to be four. For example, only one front-view camera 101 may be employed. Alternatively, the vehicle-mounted camera system may include five or more cameras installed in the vehicle. Further, images picked by the respective vehicle-mounted cameras 101 to 104 are basically used for the purpose of image display in a vehicle interior. However, the images picked by the respective vehicle-mounted cameras 101 to 104 can also be used for other purposes of object recognition (sensing) and the like of surrounding vehicles and pedestrians, roads (lanes), traffic signs, and the like. It is assumed that the technology disclosed in the present specification is applied to at least one of the vehicle-mounted cameras 101 to 104. Furthermore, the technology disclosed in the present specification may also be applied to a cabin-view camera 105 which is installed within the vehicle interior and images driver's state.

The front-view camera 101 is installed in the vicinity of the front grille of the vehicle, for example, and images a region of the front of the vehicle, which is a blind spot for a driver. Further, the front-view camera 101 picks up an image to be used for an upper region of an around-view monitor (AVM).

A front-view camera electronic control unit (ECU) 111 performs signal processing on the image picked up by the front-view camera 101. The signal processing includes processing mainly for image quality improvement such as white balance. The image data after the signal processing is transmitted to an image composition ECU 120 through a cable different from a controller area network (CAN).

The cable set forth herein may be a co-axial cable or may be a twisted pair cable. Examples of a communication method can include various standards such as low voltage differential signaling (LVDS), mobile industry processor interface (MIPI), Ethernet (registered trademark), gigabit video interface (GVIF), gigabit multimedia serial link (GMSL), and flat panel display (FPD)-Link III.

The rear-view camera 102 is mounted in the vicinity of a tailgate of the vehicle, for example. Examples of a specific mounting position can include a position next to a handle of the tailgate and a position in the vicinity of a vehicle registration plate. An optical axis direction of the rear-view camera 102 is favorably oriented slightly downward with respect to a horizontal direction. The rear-view camera 102 images a region of the rear of the vehicle, which is a blind spot for the driver, and further picks up an image to be used for a lower region of the AVM. For example, the rear-view camera 102 is activated by shifting a shift lever 130 of the vehicle into "R (reverse)".

A rear-view camera ECU 112 performs signal processing on the image picked up by the rear-view camera 102. The signal processing includes processing mainly for image quality improvement such as white balance. The image data after the signal processing is transmitted to the image composition ECU 120 through the cable different from the CAN (as described above).

The side-view cameras 103 and 104 are arranged within casings of wing mirrors or in the vicinity of the wing mirrors, for example. The side-view cameras 103 and 104 image regions of the left and right, of the vehicle, which are blind spots for the driver, and further, pick up images to be used for respective left and right regions of the AVM. Further, the side-view cameras 103 and 104 may be applied to a mirrorless car including a camera monitoring system (CMS) installed instead of the wing mirrors.

Side-view cameras ECU 113 and 114 perform signal processing on the images respectively picked up by the side-view cameras 103 and 104. The signal processing includes processing mainly for image quality improvement such as white balance. The image data after the signal processing is transmitted to the image composition ECU 120 through the cable different from the CAN (as described above).

The image composition ECU 120 combines the images picked up by the respective front, rear, and side vehicle-mounted cameras 101 to 104 to thereby generate an around-view image.

A display 140 displays the images picked up by the respective front, rear, and side vehicle-mounted cameras 101 to 104. For example, the images picked up by the respective front, rear, and side vehicle-mounted cameras 101 to 104 may be separately displayed or the around-view image generated by the image composition ECU 120 may be displayed. Further, the display 140 may switch to displaying the image of the rear of the vehicle which is picked up by the rear-view camera 102 or the around-view image generated by the image composition ECU 120 in response to the shift of the shift lever 130 into "R".

Figure 2:
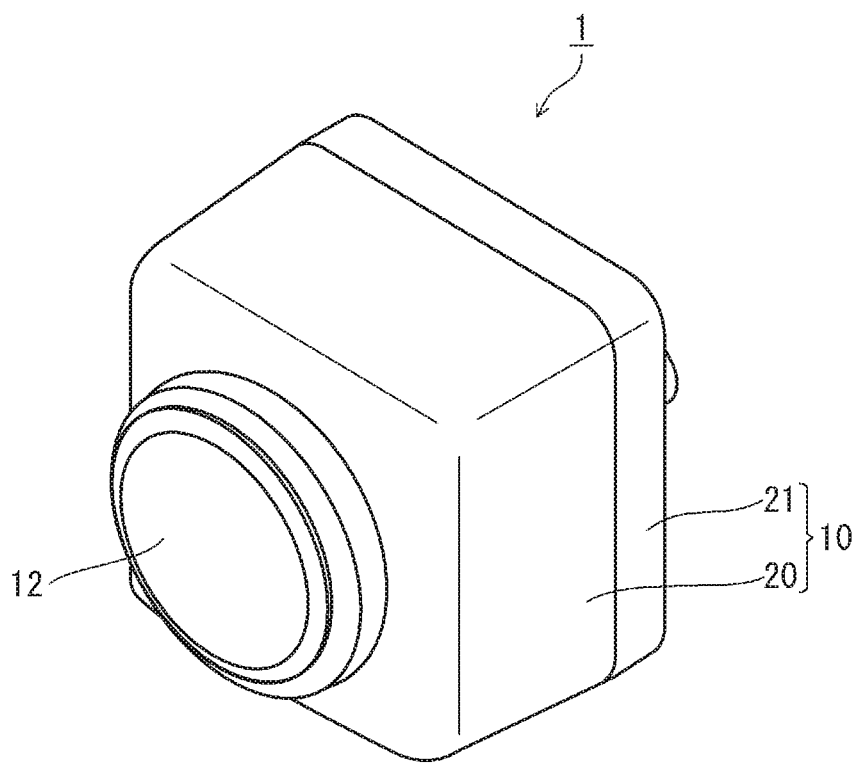
FIG. 2 is a perspective view of a camera apparatus 1.
Figure 3:
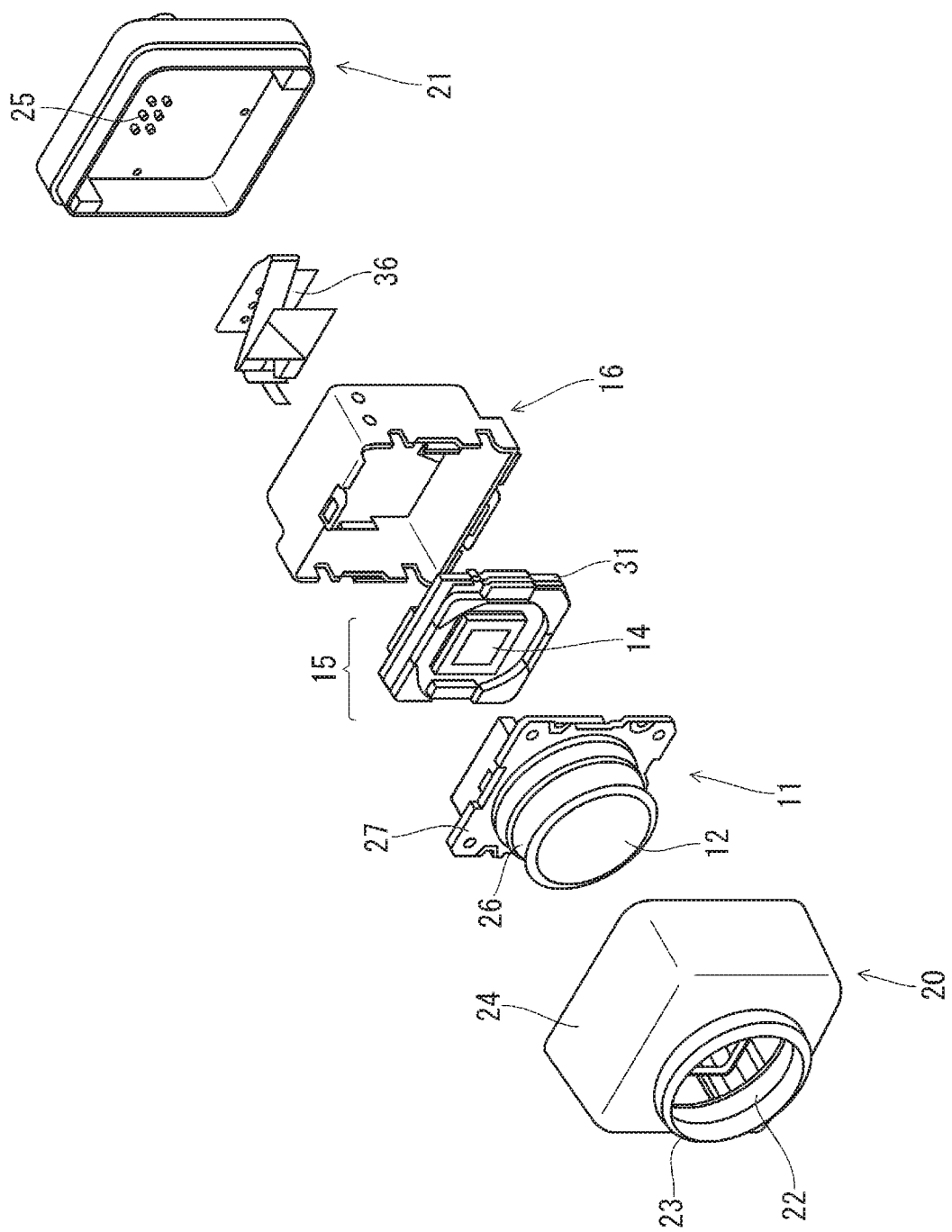
FIG. 3 is an exploded perspective view of the camera apparatus 1 as viewed from a front side.
Figure 4:
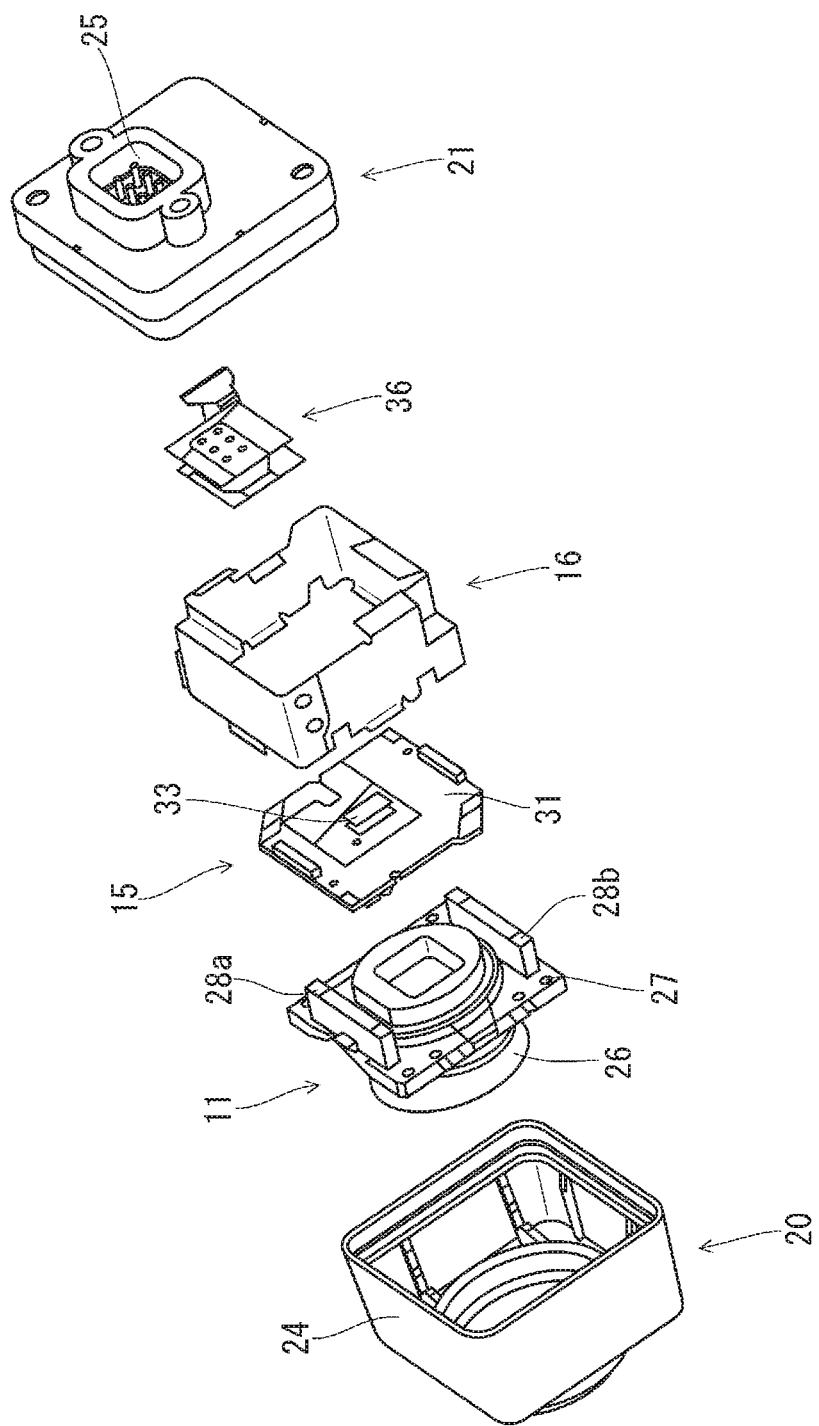
FIG. 4 is an exploded perspective view of the camera apparatus 1 as viewed from a back side.

FIG. 2 shows a perspective view of a camera apparatus 1 to which the technology disclosed in the present specification is applied. Further, FIG. 3 shows an exploded perspective view of the camera apparatus 1 as viewed from a front side and FIG. 4 shows an exploded perspective view of the camera apparatus 1 as viewed from a back side. The camera apparatus 1 is utilized as at least one of the vehicle-mounted cameras 101 to 104. Hereinafter, a configuration of the camera apparatus 1 will be described with reference to FIGS. 2 to 4.

The camera apparatus 1 includes a housing 10 having an approximately rectangular parallelepiped shape, a lens barred 11 fit in the housing 10, and an image pickup mechanism including an image pickup element 14 that captures a picture input via an image pickup lens 12 incorporated in the lens barred 11. In addition, a shield chassis 16 is provided in the housing 10. The shield chassis 16 shields unnecessary electromagnetic waves generated inside and outside the camera apparatus 1.

The housing 10 is a structure obtained by bring an upper and lower pair of a front case 20 and a rear case 21 into contact with each other and coupling them. The front case 20 and the rear case 21 are molded in an approximately rectangular parallelepiped shape with resin such as engineering plastic, for example. Then, the front case 20 and the rear case 21 are coupled by ultrasonic welding or with a screw or an adhesive or the like after end edges of openings thereof are brought into contact with each other. Alternatively, shielding of unnecessary electromagnetic waves can also be further reinforced by forming the front case 20 and the rear case 21 of an electrically conductive material such as a magnesium alloy.

The front case 20 includes a cylindrical portion 23 provided with a circular lens opening 22 at approximately its center and a front-case main body 24 having an approximately rectangular parallelepiped shape. The cylindrical portion 23 is provided protruding from a front surface of the front-case main body 24.

The lens barrel 11 is fit into the front-case main body 24. Further, an end edge on a back side of the front-case main body 24 is coupled with an end edge on a front side of the rear case 21.

The cylindrical portion 23 is provided with the circular lens opening 22 at approximately its center portion. The lens opening 22 has a slightly larger diameter than an outer diameter of the lens barrel 11. The lens barrel 11 is attached by being inserted from a back side of the front case 20 and being brought into contact with an inside of a boundary portion between the cylindrical portion 23 and the front-case main body 24.

The rear case 21 has an approximately rectangular parallelepiped shape which can be coupled with the front-case main body 24. A connector 25 is provided in the rear case 21 on its bottom surface. The connector 25 is to connect to an image pickup mechanism 15.

The lens barrel 11 includes a cylindrical barrel portion 26 and a flange portion 27 to be joined to a board 31 of the image pickup mechanism 15. The flange portion 27 has a rectangular plate shape. The barrel portion 26 is formed at the center of a surface on a front side of the flange portion 27. The image pickup lens 12 is incorporated inside the barrel portion 26. Further, a pair of connection blocks 28a and 28b are arranged on the back side of the flange portion 27. The pair of connection blocks 28a and 28b connect to the board 31 of the image pickup mechanism 15. The connection blocks 28a and 28b are joined to the board 31 with an adhesive or a screw or by ultrasonic weld, or the like.

The image pickup element 14 is mounted on the front side of the image pickup mechanism 15. The image pickup mechanism 15 includes the board 31 on which one or more circuit chips 33 are mounted at the back side thereof. An image sensor including a charge coupled device (CCD), a complementary metal oxide semiconductor (CMOS), and the like, for example, can be used for the image pickup element 14. Further, the image pickup element 14 may be a backside illumination type image sensor. Further, the circuit chips 33 set forth herein include a driving circuit for driving the image pickup element 14, the ECU (described above) that performs signal processing of a picked up image and external transmission processing of image data after the signal processing. It should be noted that an application target of the technology disclosed in the present specification is not limited to the configuration in which the image pickup element 14 and the circuit chips 33 are mounted on the board 31. For example, also with a stacked image sensor in which the circuit chips 33 are integrally formed with the image pickup element 14, the technology disclosed in the present specification can be similarly applied.

The board 31 is a rigid board having an approximately rectangular shape. The board 31 is made to adhere to the connection blocks 28a and 28b on the side of the image pickup mechanism 15 with an adhesive or a screw or by ultrasonic welding or the like after the focus of the image pickup lens 12 is controlled while the image pickup element 14 is opposed to the image pickup lens 12 facing the back side of the lens barrel 11. It should be noted that although the image pickup mechanism 15 includes the single board 31 in the example shown in the figure, the image pickup mechanism 15 may include a combination of two or more boards.

The shield chassis 16 is provided inside the housing 10. The shield chassis 16 shields the board 31 from unnecessary electromagnetic waves generated inside and outside the camera apparatus 1. The shield chassis 16 is formed of an elastic and electrically conductive metal plate. The shield chassis 16 is formed in a hollow, approximately quadrangular prism shape by forming a desired outline shape by blanking and then performing bending work thereon, for example. The shield chassis 16 is larger than the area of the board 31. Meanwhile, the shield chassis 16 is one size smaller than the housing 10 (or the rear case 21). The shield chassis 16 is provided along an inner surface of the rear case 21 and covers a circumference of the board 31. The shield chassis 16 has a front surface and a back surface which are both opened. Therefore, the board 31 and the connector 25 on the side of the rear case 21 can be electrically connected to each other by use of a flexible printed circuit (FPC) 36 via an opening on the back side of the shield chassis 16.

Figure 5:
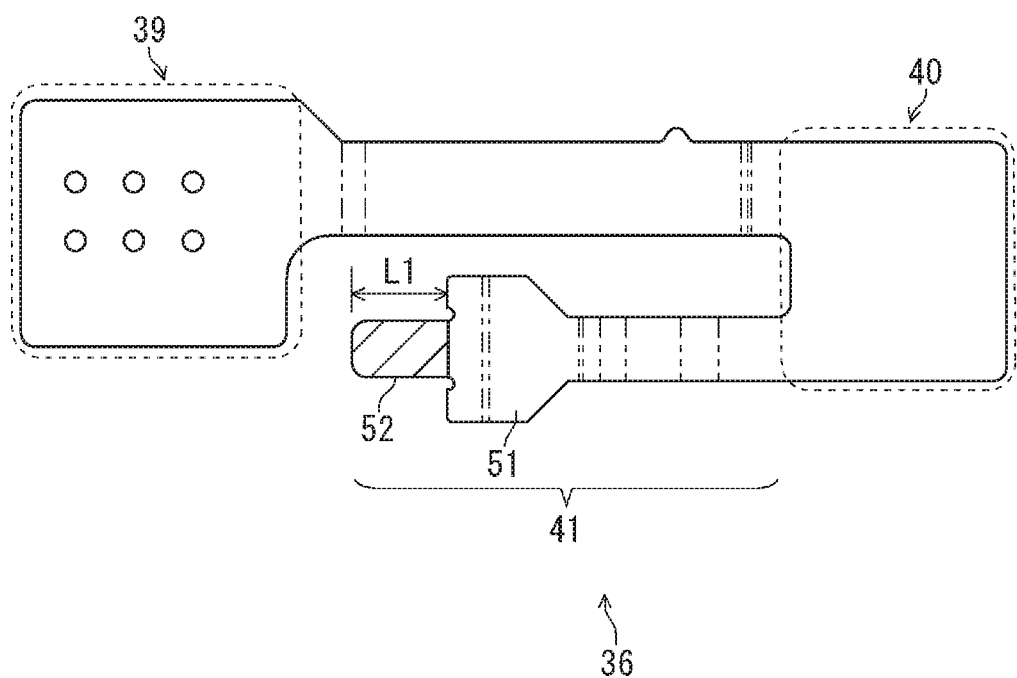
FIG. 5 is a plan view of a flexible printed circuit 36.

FIG. 5 shows a plan view of the flexible printed circuit 36. The flexible printed circuit 36 electrically connects the board 31 to the connector 25 on the side of the rear case 21. Although the flexible printed circuit 36 includes a plurality of signal line pattern portions, detailed illustration of the signal line pattern portions is omitted from FIG. 5 for the sake of simplification.

The flexible printed circuit 36 shown in the figure has an approximately U-shape. A connector connection portion 39 for electrically connecting to the connector 25 on the side of the rear case 21 is formed in the vicinity of an open end portion of the U-shape. A terminal portion 40 for electrically connecting to a board connector (not shown) on the side of the board 31 is formed in the vicinity of a valley portion of the U-shape. The plurality of signal line pattern portions for electrically connecting the board 31 to the connector 25 on the side of the rear case 21 are formed between the connector connection portion 39 and the terminal portion 40.

Further, the flexible printed circuit 36 is formed in an approximately U-shape by including an FPC extension portion 41 further extended from the terminal portion 40. The FPC extension portion 41 includes the signal line pattern portions electrically connected to a ground pattern portion on the board 31 via the terminal portion 40, for example. Therefore, the ground of the board 31 is reinforced by connecting the FPC extension portion 41 to the shield chassis 16.

It should be noted that the flexible printed circuit 36 is not particularly limited to the U-shape as long as it includes the FPC extension portion 41. For example, instead of the U-shape including the FPC extension portion 41 turned back from the terminal portion 40 as shown in FIG. 5, an L-shape bent at an approximately right angle at the terminal portion 40 or another curved shape may be employed. Or, a shape including the FPC extension portion 41 approximately linearly extended from the terminal portion 40 may be employed. Alternatively, a configuration in which the ground pattern portion of the board 31 and the shield chassis 16 are connected to each other through a flexible printed circuit specialized for reinforcing the ground may be employed, the flexible printed circuit being independent (separate) from the flexible printed circuit 36 that electrically connects the board 31 and the connector 25 on the side of the rear case 21 to each other.

A configuration of the FPC extension portion 41 and a method for connecting/fixing the FPC extension portion 41 to the side of the shield chassis 16 will be described in more detail.

The FPC extension portion. 41 includes an expanded portion 51 and a tongue portion 52. The expanded portion 51 has a board width increased in the vicinity of the other open end of the U-shape. The tongue portion 52 is further provided protruding from a leading end edge of the expanded portion 51 and has a reduced board width. By sandwiching this tongue portion 52 by a clip portion integrally formed with the shield chassis 16 which is formed of a metal plate as will be described later, the ground of the board 31 can be reinforced. It should be noted that the operability in work of attachment to the clip portion can be improved by enhancing the rigidity by superimposing (or stacking) a reinforcing plate made of polyamide (PA) and the like, for example, on the vicinity of a leading end of the FPC extension portion 41.

Figure 6:
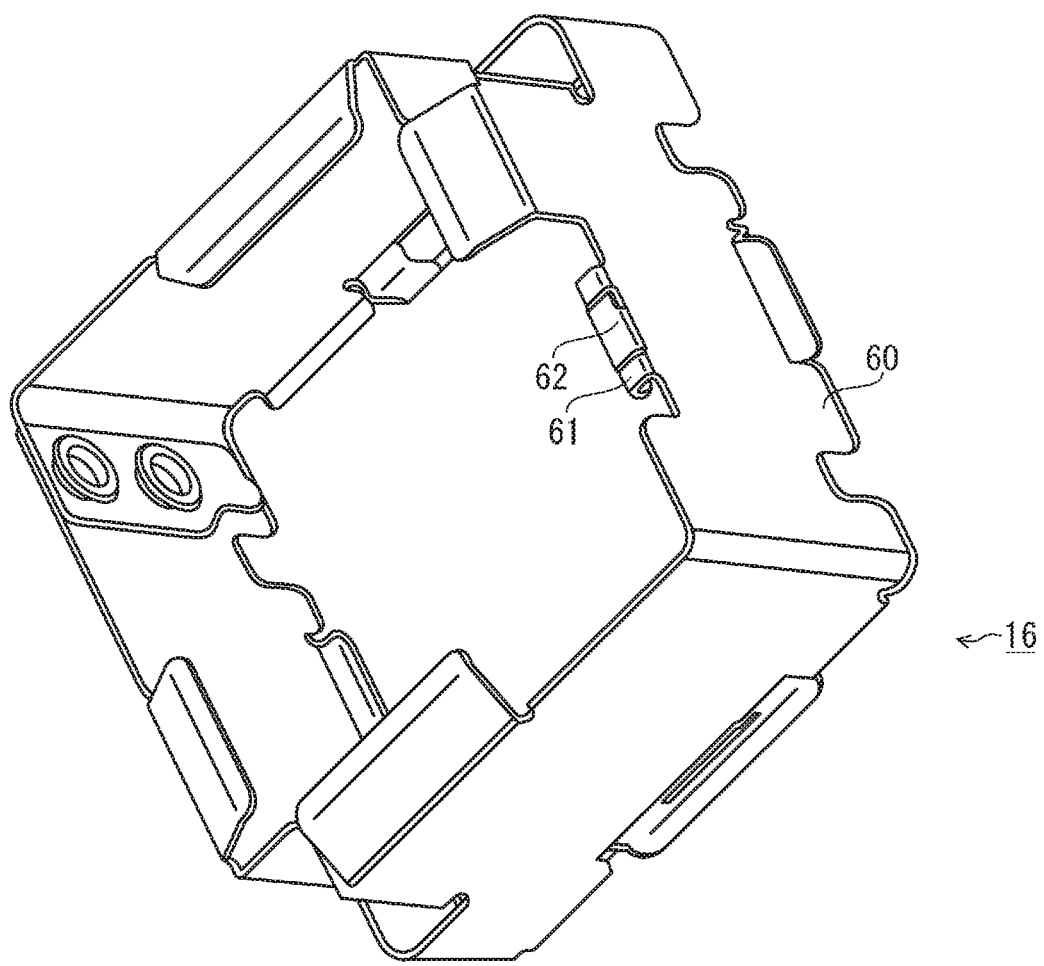
FIG. 6 is an enlarged perspective view of a shield chassis 16.

FIG. 6 shows the shield chassis 16 shown in FIG. 4 (as a perspective view from the back of the camera apparatus 1) in an enlarged manner. The shield chassis 16 is a member which has a hollow, approximately quadrangular prism shape and covers a circumference of the board 31 (as described above). The shield chassis 16 is formed of the elastic and electrically conductive metal plate. The shield chassis 16 can be produced by forming a desired outline shape by blanking and then performing bending work thereon, for example.

In this embodiment, the clip portion 61 is formed at an upper end edge of one wall surface 60 of the shield chassis 16. The clip portion. 61 has a cross-section having an approximately C-shape. The clip portion 61 is capable of sandwiching an object by restoring force generated when the open end portion whose cross-section has an approximately C-shape is extended.

In addition, a slit-like opening 62 is formed in an upper surface of the clip portion 60 (or in the vicinity of the center of the C-shape). The tongue portion 52 of the leading end of the FPC extension portion 41 (or the flexible printed circuit 36) can be inserted into the slit-like opening 62 (i.e., slightly larger than the width of the tongue portion 52).

When the tongue portion 52 inserted through this opening 62 reaches the open end of the clip portion 61, the clip portion 61 is deformed so as to increase the width of the open end due to the thickness of the tongue portion 52. Then, the tongue portion 52 is sandwiched by restoring force generated in the clip portion 61, such that the FPC extension portion 41 (or the flexible printed circuit 36) is fixed to the shield chassis 16. At the same time, the signal line pattern portions included in the FPC extension portion 41 electrically connect to the shield chassis 16, such that the ground of the board 31 is reinforced. The clip portion 61 is integrated with the shield chassis 16 formed of the elastic and electrically conductive metal plate. Therefore, the number of components does not increase in fixation and electrical connection of the FPC extension portion 41 (or the tongue portion 52).

Figure 7:
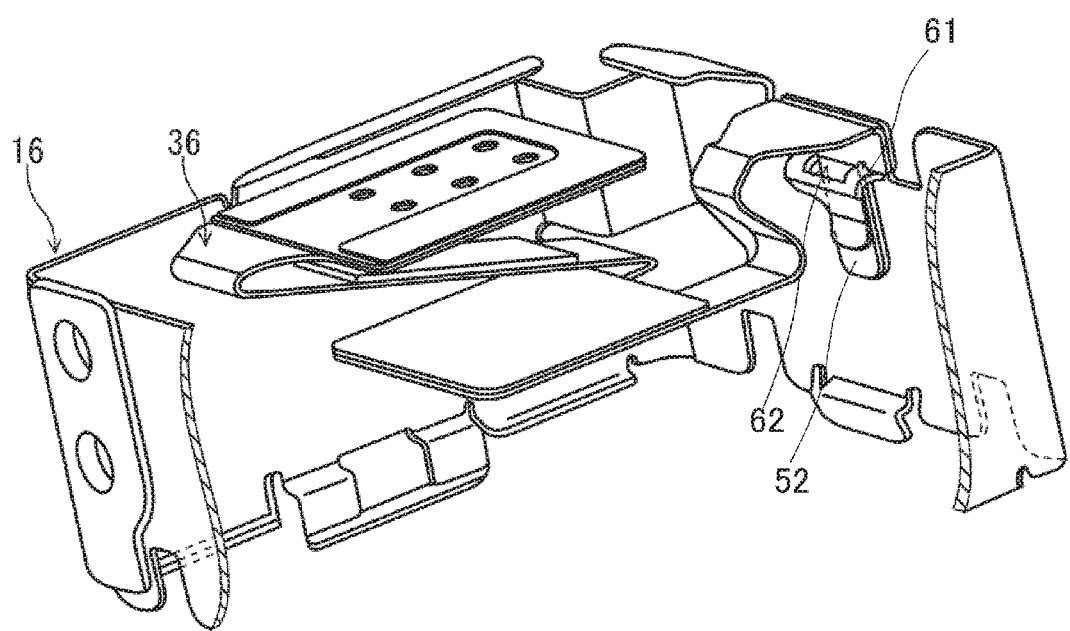
FIG. 7 is a perspective view showing a state in which the flexible printed circuit 36 is mounted by inserting a tongue portion 52 into a clap portion 61 of the shield chassis 16.

FIG. 7 shows a state in which the tongue portion 52 of the leading end of the FPC extension portion 41 is attached to the shield chassis 16 by being inserted into the clip portion 61 through the opening 62. It should be noted that it is illustrated such that the interior can be seen by cutting out the wall surface on the front side of the shield chassis 16.

Regarding the clip portion 61, a clip whose cross-section has an approximately C-shape can be formed in the following manner. When the outline shape of the metal plate that is the material of the shield chassis 16 is formed by blanking, for example, a projection is formed in an upper end edge portion of the wall surface 60. This projection is repeatedly bent at a plurality of positions in a longitudinal direction of from the root to the leading end.

Figure 8:
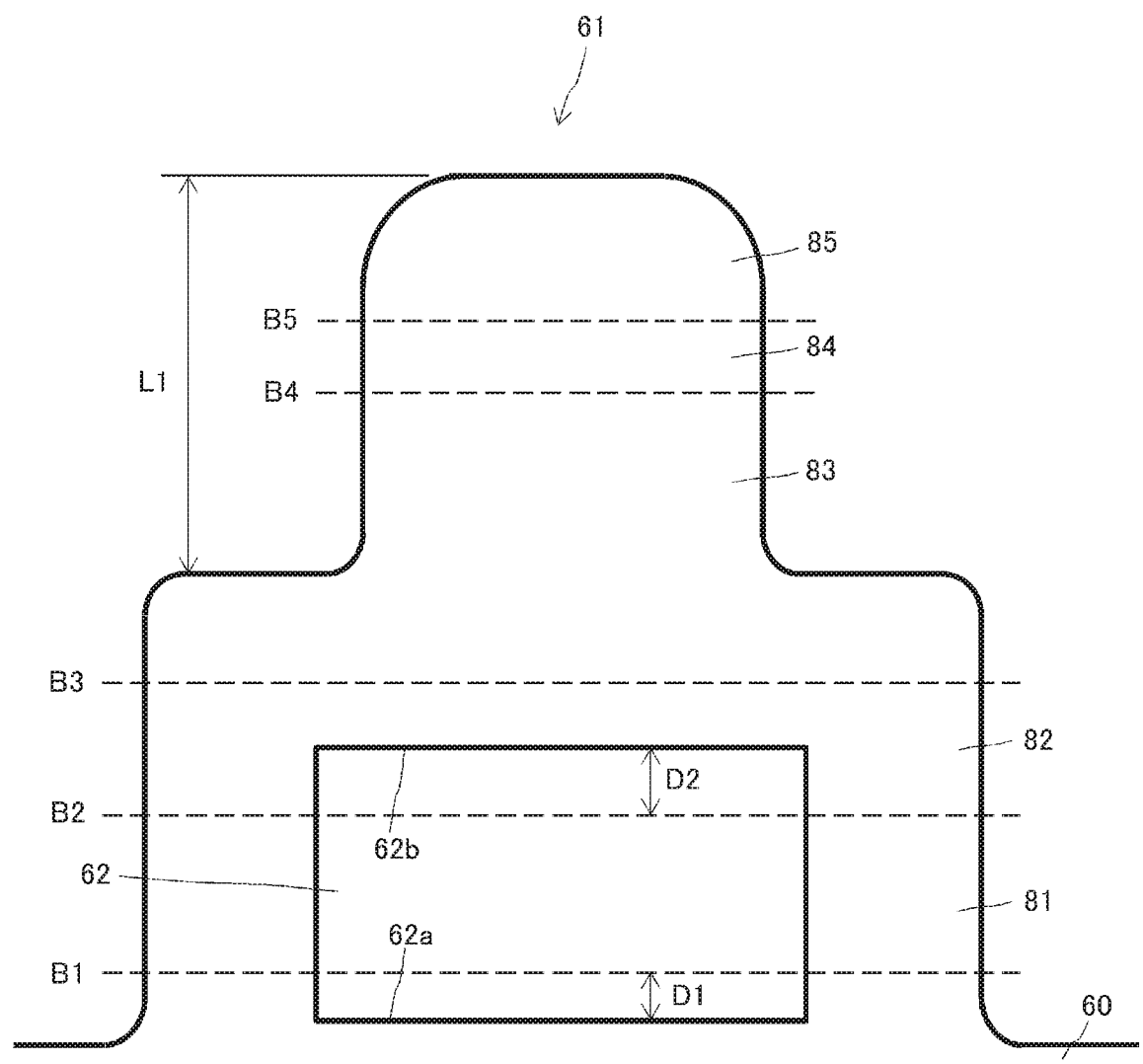
FIG. 8 is a net of the clip portion 61.

FIG. 8 shows a net of the clip portion 61 before bending. As shown in the figure, the clip portion 61 includes a projection of the metal plate that is the material of the shield chassis 16, which is formed at the upper end edge portion of the wall surface 60. In the figure, bending parts at which bending is performed are denoted by the dotted lines B1 to B5. By repeatedly performing bending at suitable angles respectively at the respective bending parts denoted by those dotted lines B1 to B5, a first bending piece 81, a second bending piece 82, a third bending piece 83, a fourth bending piece 84, and a fifth bending piece 85 are sequentially formed. Finally, the clip portion 61 whose cross-section has an approximately C-shape is completed.

Figure 9:
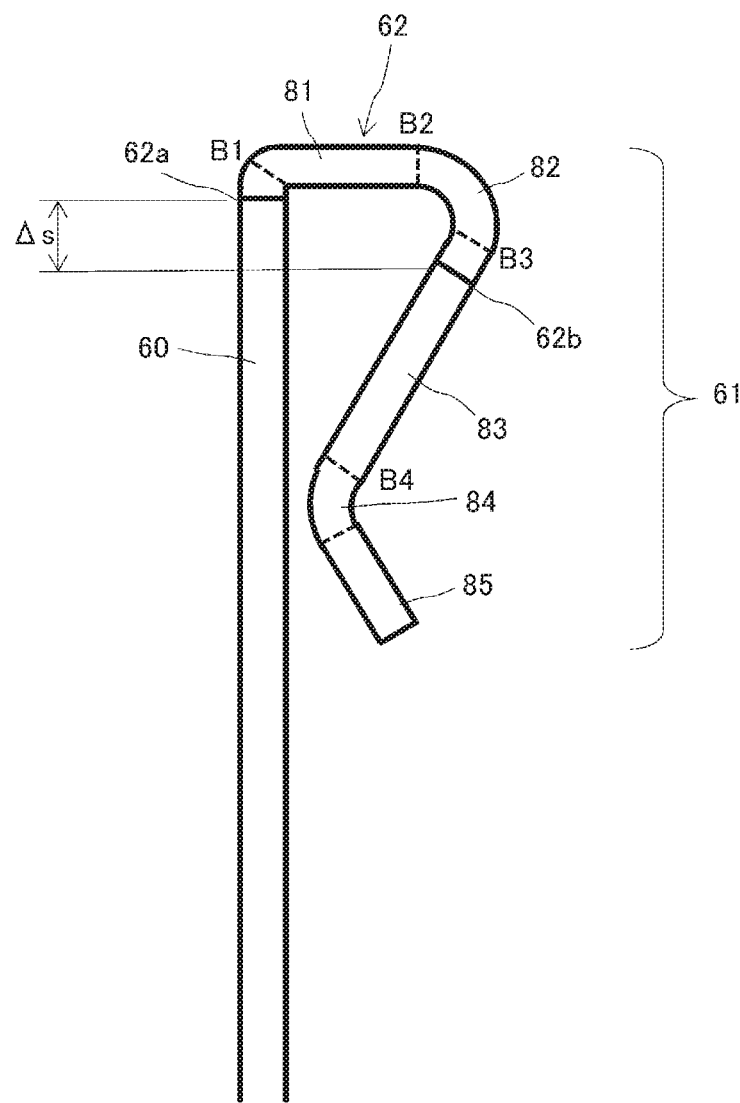
FIG. 9 is a cross-sectional view of the clip portion 61.

Further, FIG. 9 shows a cross-section of the clip portion 61 having an approximately C-shape. The clip portion 61 is configured by bending the projection of the upper end edge portion of the wall surface 60 of the shield chassis 16 at a plurality of positions. As it can be seen from the figure, a clearance from the wall surface 60 is minimum at the fourth bending piece 84. Therefore, when the tongue portion 52 of the FPC extension portion 41 inserted into the clip portion 61 through the opening 62 reaches the fourth bending piece 84 (or the leading end of the tongue portion 52 moves beyond the fourth bending piece 84), the clearance between the fourth bending piece 84 and the wall surface 60 is increased due to the thickness of the tongue portion 52, the clip portion 61 is deformed, and restoring force to sandwich the tongue portion 52 is generated. As a result, the FPC extension portion 41 can be stably attached to the shield chassis 16.

Further, under the sandwiching state, the tongue portion 52 can be reliably held in contact by the clip portion. 61 by using the surface of the fourth bending piece 84 as a point of contact. As a result, electrical connection between the signal line pattern portions included in the FPC extension portion 41 and the shield chassis 16 can be stably maintained. Thus, the ground of the board 31 can be reinforced.

Figure 10:
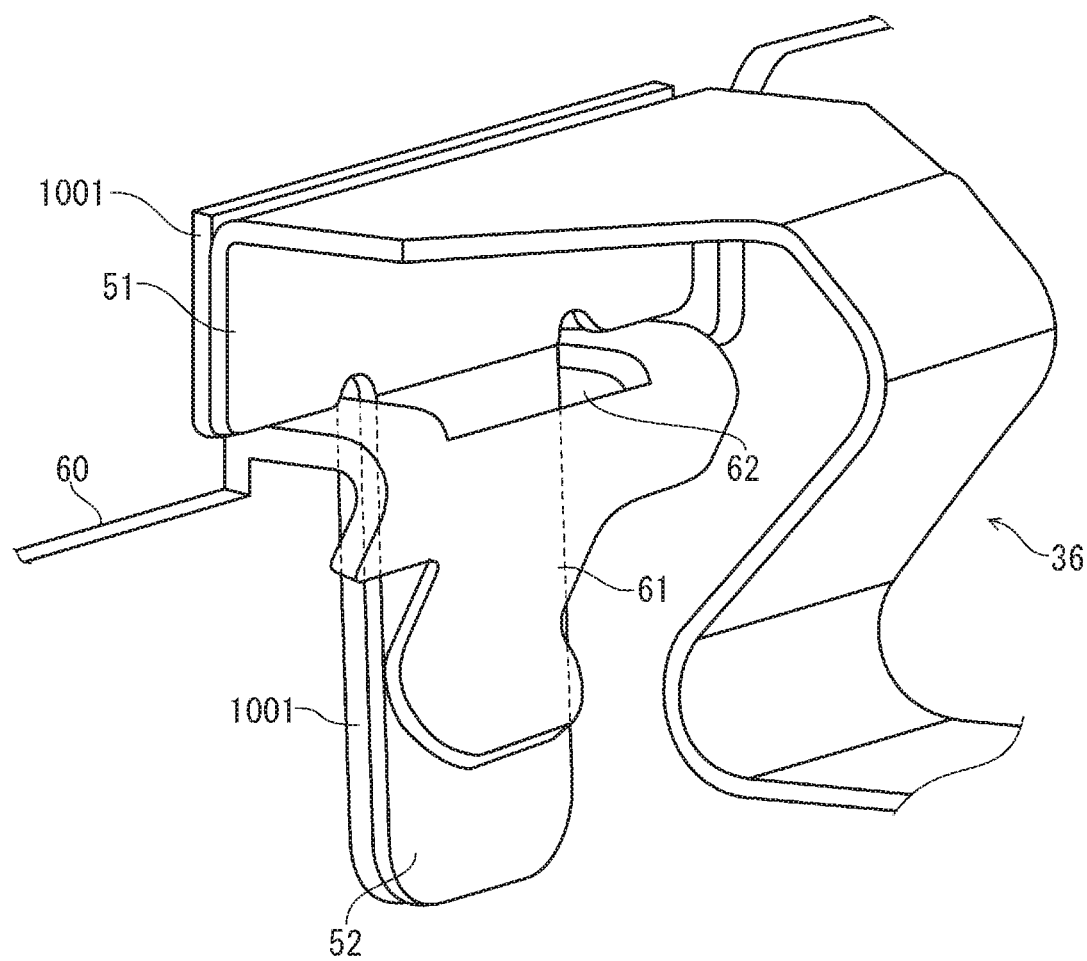
FIG. 10 is a perspective view showing a state of the clip portion 61 with the tongue portion 52 of an FPC extension portion 41 being inserted therein in an enlarged manner.

FIG. 10 shows a state of the clip portion 61 with the tongue portion 52 of the FPC extension portion 41 being inserted therein in an enlarged manner. Further, FIG. 11 shows a cross-section of the clip portion 61 with the tongue portion 52 of the FPC extension portion 41 being inserted therein.

The FPC extension portion 41 includes the expanded portion 51 having the board width increased once in the vicinity of the other open end of the U-shape and the tongue portion 52 further provided protruding from the leading end edge of the expanded portion 51 and having the board width reduced (as described above). On the other hand, the slit-like opening 62 formed in the upper surface of the clip portion 61 is slightly larger than the width of the tongue portion 52, and the slit-like opening 62 allows the tongue portion 52 to be inserted therein while it is smaller than the width of the expanded portion 51. Therefore, when the leading end of the FPC extension portion 41 (or the flexible printed circuit 36) is inserted into the opening 62, the tongue portion 52 can pass through the opening 62 while the tongue portion 52 cannot pass through the expanded portion 51. Therefore, as shown in FIG. 10, by the leading end edge of the expanded portion 51 being held in contact with the upper surface of the clip portion 61 (both edges of the opening 62), the one inserted in the clip portion 61 is limited only to the tongue portion 52. That is, an amount of insertion of the FPC extension portion 41 into the clip portion 61 can be managed to be constant (length L1 of the tongue portion 52).

Here, if a length L2 of the clip portion 61 is made smaller than the length L1 of the tongue portion 52 (i.e., L1>L2), a lower end of the tongue portion 52 protrudes from a leading end of the clip portion 61 when the tongue portion 52 is inserted through the opening 62 completely (i.e., until the end edge of the expanded portion 51 is brought into contact with the upper surface of the clip portion 61). Therefore, as can be seen from FIG. 10, the amount of insertion of the tongue portion 52 into the clip portion 61 can be visually checked in assembling work.

Figure 11:
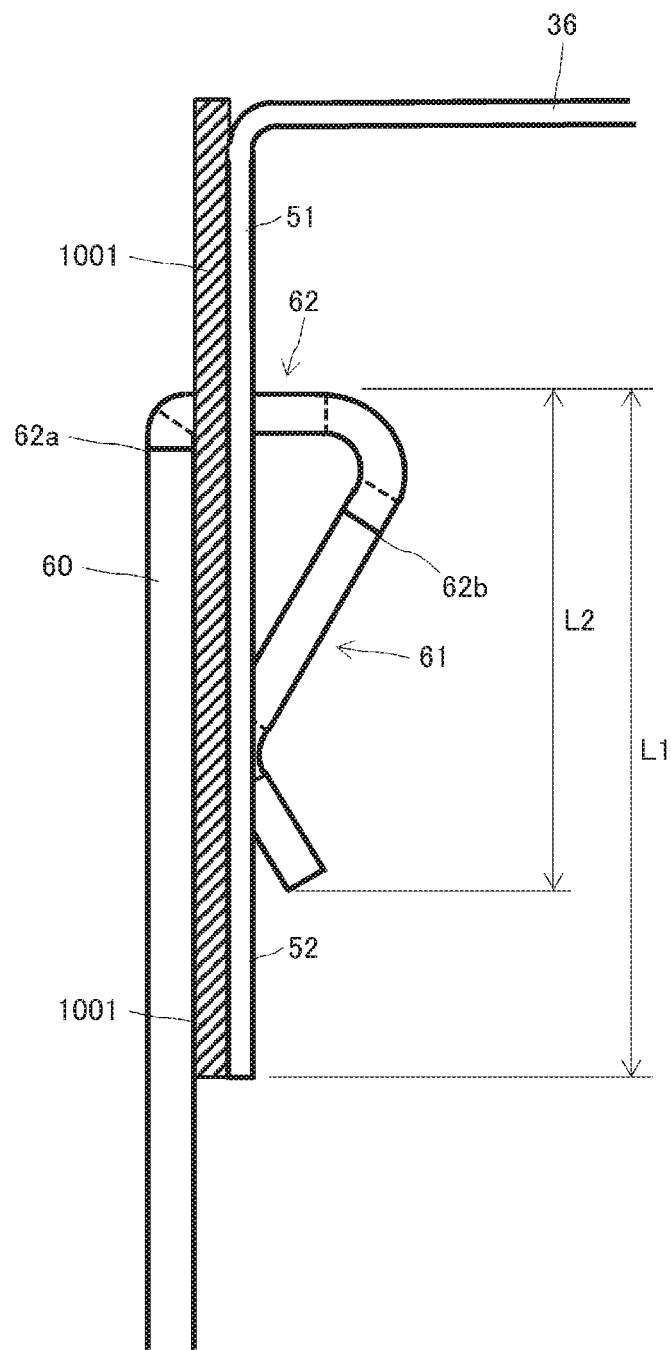
FIG. 11 is a cross-sectional view of the clip portion 61 with the tongue portion 52 of the FPC extension portion 41 being inserted therein.

Further, as shown in FIGS. 10 and 11, on the back side of the vicinity of the leading end of the FPC extension portion 41 (in a range of from the tongue portion 52 to the vicinity of a leading end of the expanded portion 51), a reinforcing plate 1001 made of PA and the like, for example, is stacked and the rigidity is reinforced (in FIG. 11, the reinforcing plate 1001 is shown with oblique lines). Only with the material of the FPC, it is difficult to insert the tongue portion 52 into the opening 62 because it is soft and is liable to warp. In contrast, in a case where the rigidity is reinforced by the reinforcing plate 1001 from the vicinity of the root of the tongue portion 52, it is easy to perform the work of inserting the tongue portion 52 into the opening 62 because it is hard to warp. Then, when the tongue portion 52 inserted through the opening 62 reaches the open end of the clip portion 61, the tongue portion 52 is sandwiched by the clip 61 together with the reinforcing plate 1001.

The slit-like opening 62 formed in the upper surface of the clip portion 61 is formed to be slightly larger than the width of the tongue portion 52. Therefore, when the tongue portion 52 is to be inserted into the clip portion 61 through the opening 62, the tongue portion 52 is easily guided to a lower side of the clip portion 61 by using both ends of the opening 62 as a guide and sliding at least one of left and right side edges of the tongue portion 52 while pushing it against an end portion of the opening 62.

Figure 12:
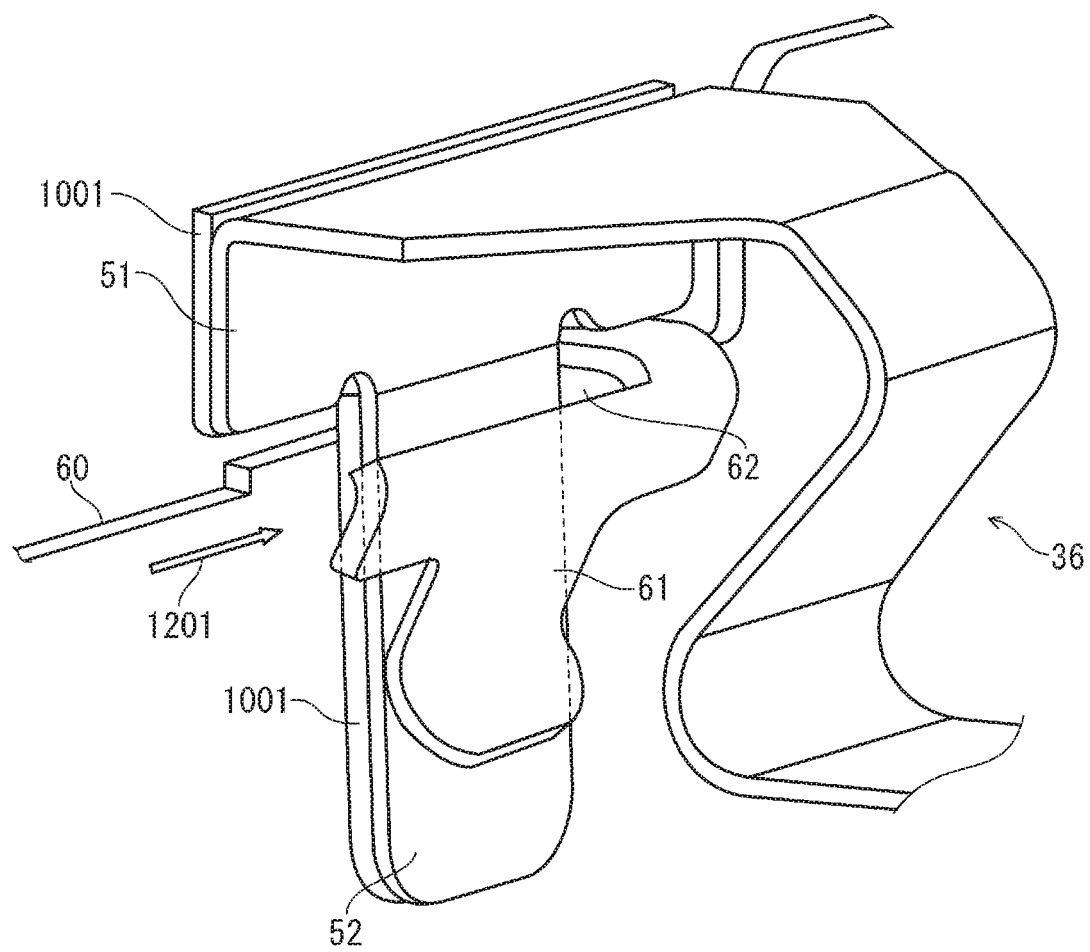
FIG. 12 is a perspective view showing a modified example of the clip portion 61.

FIG. 12 shows a modified example of the clip portion 61 with the tongue portion 52 of the FPC extension portion 41 being inserted therein. In the example shown in the figure, one side (in the figure, the front side) of the slit-like opening 62 is the open end. In such a case, by using only the end portion of one side of the opening 62 on the other side (in the figure, the deep side) of the opening 62 as the guide and sliding a side edge of the tongue portion 52 while pushing it against the end portion of the opening 62, the tongue portion 52 is easily guided to the lower side of the clip portion 61. Alternatively, the tongue portion 52 can be easily attached to the clip portion 61 even if the tongue portion 52 is inserted through the open end of the opening 62 in a horizontal direction (in the arrow direction denoted by the reference number 1201).

Figure 13:
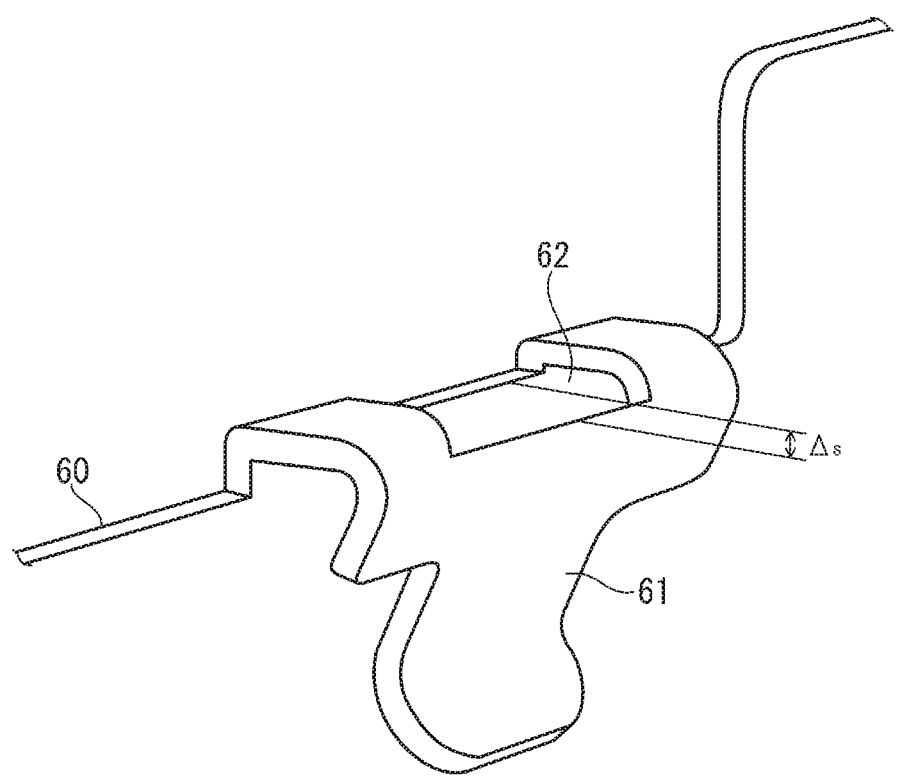
FIG. 13 is a perspective view showing a state of the clip portion 61 in an enlarged manner.
Figure 14:
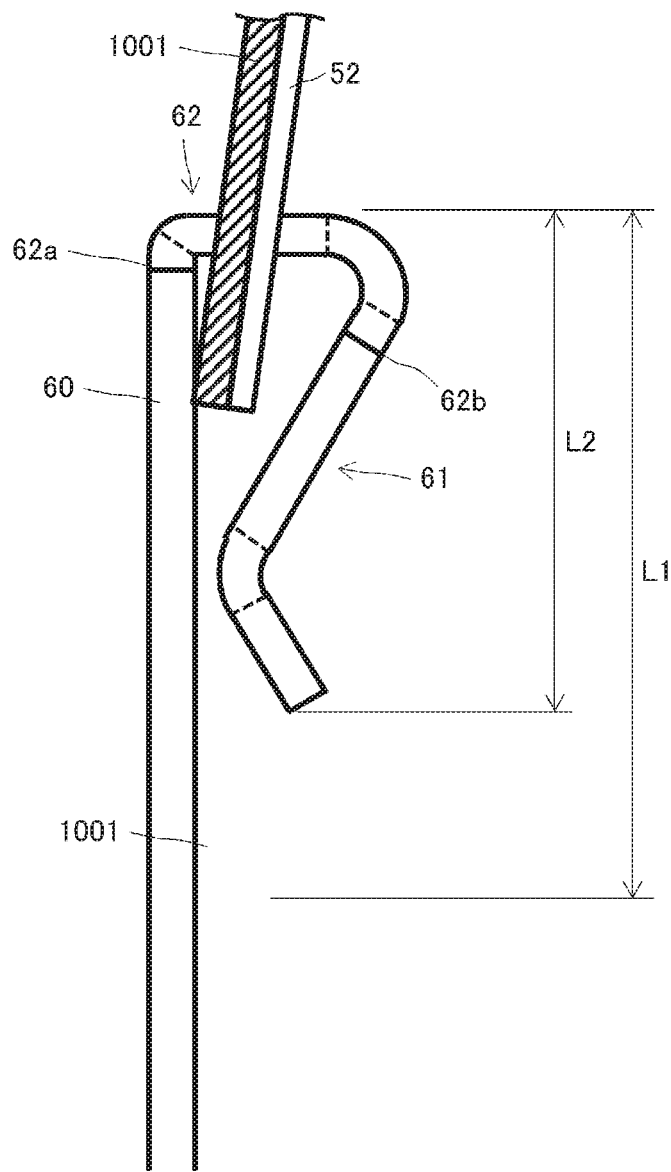
FIG. 14 is a cross-sectional view showing a state in which the tongue portion 52 of the FPC extension portion 41 is being inserted into the clip portion 61.

FIG. 13 shows a state of the clip portion 61 (with the tongue portion 52 of the FPC extension portion 41 not inserted) in an enlarged manner. Referring to FIGS. 13 and 9, a stepped structure in which an end edge 62a on a deep side of the opening 62 (on a root side of the clip portion 61 or on a side closer to the wall surface 60) is higher than an end edge 62b on the front side (on a side closer to the leading end of the clip portion 61) by Δs is provided. Further, FIG. 14 shows a state in which the tongue portion 52 of the FPC extension portion 41 is being inserted into the portion 61. The stepped structure serves as a guide for inserting the tongue portion 52 into the opening 62 in attaching the FPC extension portion 41 to the clip portion 61. That is, an assembling worker inserts the tongue portion 52 while pushing the leading end of the tongue portion 52 against an inner surface of the wall surface 60 of the shield chassis 16 by utilizing the above-mentioned stepped structure of the opening 62. In this manner, the tongue portion 52 can be made to accurately fall in the clearance between the fourth bending piece 84 of the clip portion 61 and the wall surface 60.

Referring back to FIG. 8, by setting a distance D2 from the end edge 62b on the front side (on the side closer to the leading end of the clip portion 61) to the second bending part B2 to be larger than a distance D1 from the end edge 62a on the deep side of the opening 62 (on the root side of the clip portion 61) to the first bending part B1 (i.e., D2>D1), the above-mentioned stepped structure can be formed (i.e., Δs≈D2-D1).

Hereinabove, the structure for maintaining electrical connection between the FPC extension portion 41 and the shield chassis 16 in such a manner that the tongue portion 52 is sandwiched by the clip portion 61 formed integrally with the shield chassis 16 has been described.

In a case where the camera apparatus 1 is used in an environment where vibration frequently occurs, like a vehicle, it is necessary to prevent the tongue portion 52 sandwiched by the clip portion 61 from being easily detached.

Primarily, the clip portion 61 needs to be designed to provide sufficient reaction force to prevent the tongue portion 52 from being detached even with generated force estimated during a vibration test. In addition, it is favorable to provide a structure with which the tongue portion 52 is hard to fall.

Figure 15:
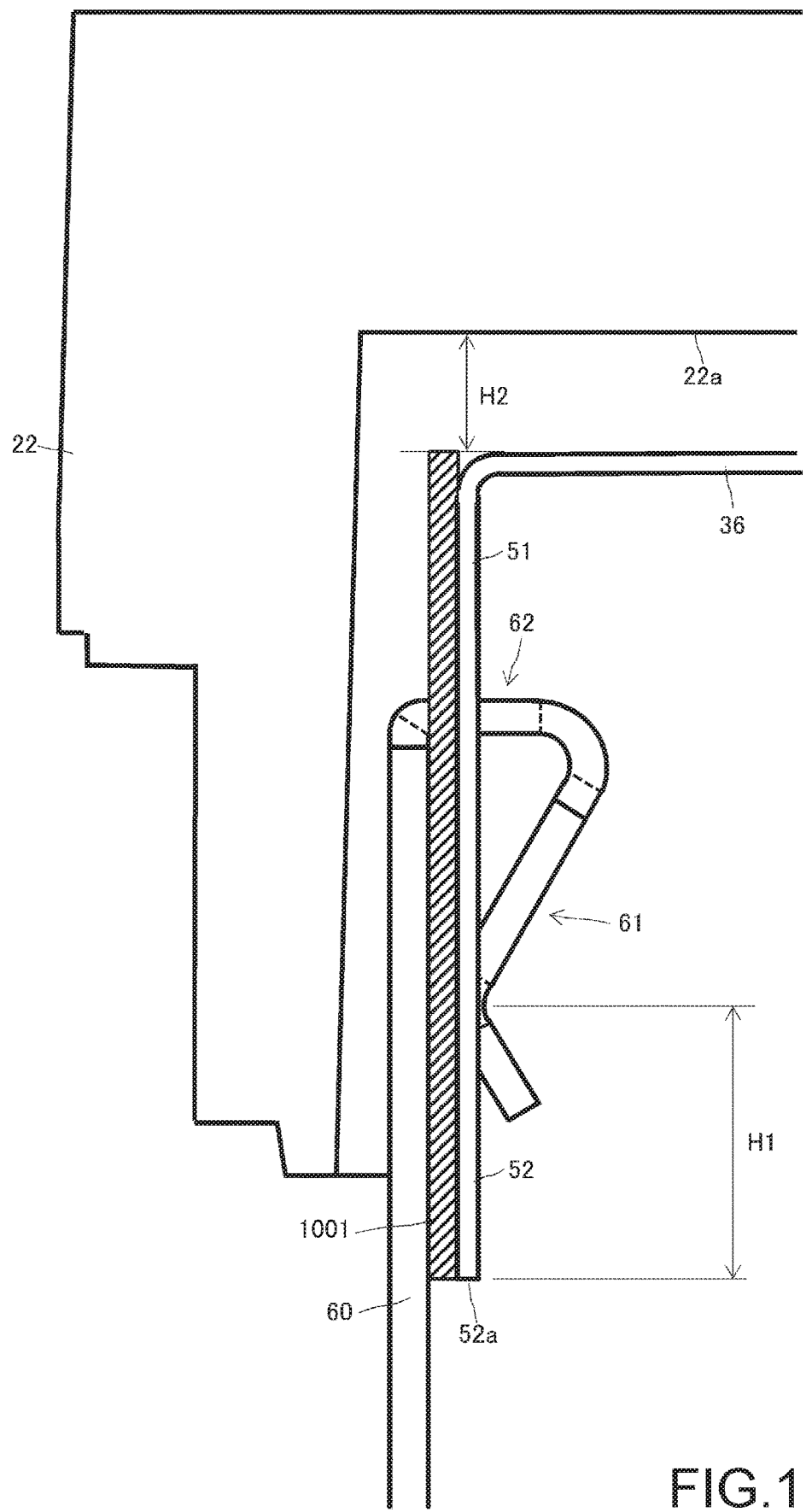
FIG. 15 is a cross-sectional view of the shield chassis 16 mounted on a rear case 21.

First of all, influences of vibration of the vehicle in the upper and lower directions will be considered. FIG. 15 shows a cross-section of the shield chassis 16 attached to the rear case 21. It should be noted that it is assumed that in the figure, the tongue portion 52 of the FPC extension portion 41 is inserted into the opening 62 completely (i.e., until the leading end edge of the expanded portion 51 is brought into contact with the upper surface of the clip portion 61).

There is a fear that due to the influences of vibration of the vehicle in the upper and lower directions, the tongue portion 52 sandwiched by the clip portion 61 is deviated in the upper direction, and further, the tongue portion 52 is detached from the clip portion 61 and the FPC extension portion 41 falls.

Referring to FIG. 15, the deviation can occur within a maximum period until an upper end of the reinforcing plate 1001 (or an end surface of the FPC extension portion 41) is brought into contact with a bottom surface 22a of a rear case 22. That is, a distance H2 (or a clearance between the upper end of the reinforcing plate 1001 and an inner wall of the housing 10) from the upper end of the reinforcing plate 1001 to the bottom surface 22a of the rear case 22 at the time of assembling is an estimated maximum amount of deviation in the upper direction.

Figure 16:
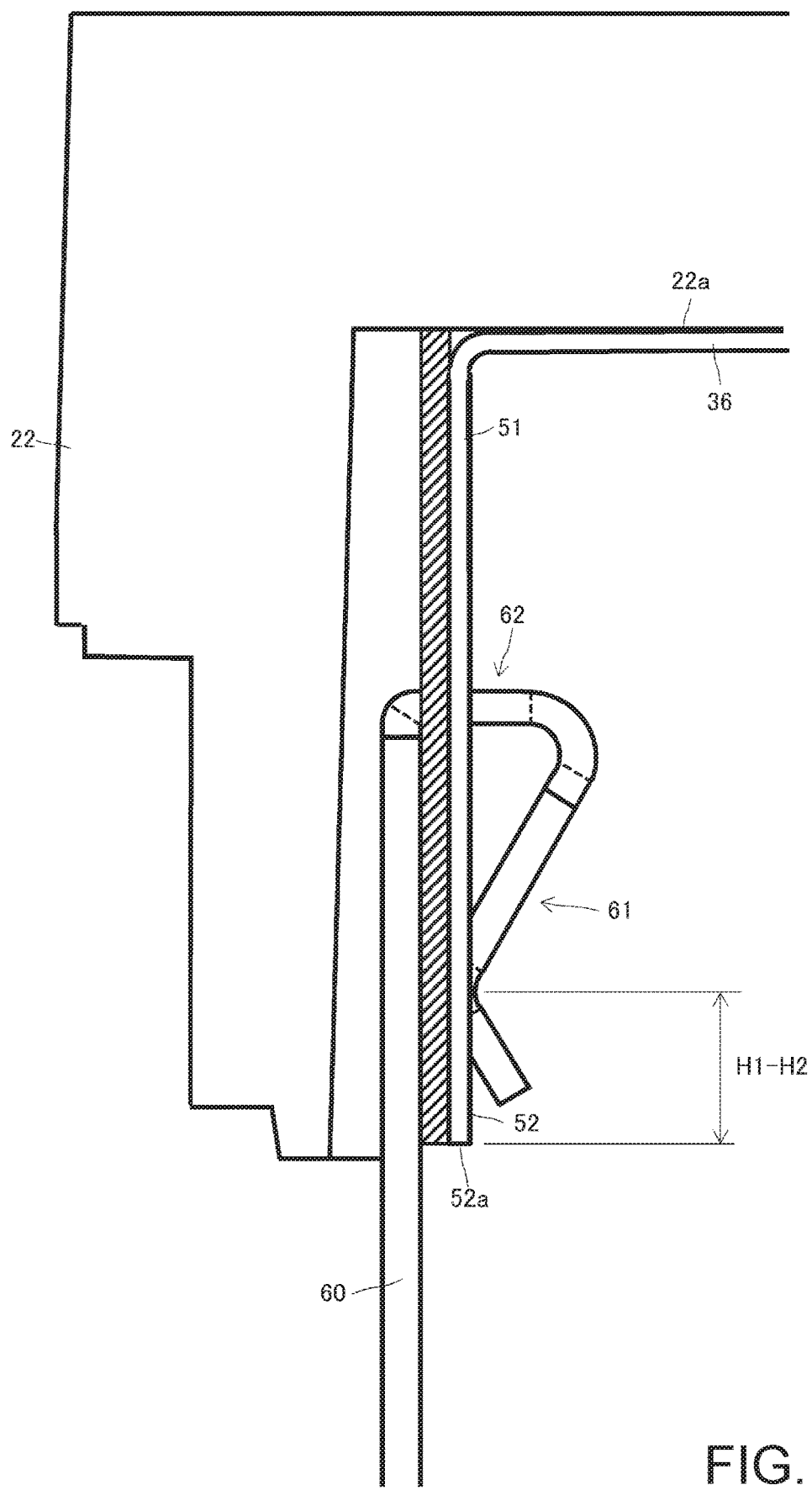
FIG. 16 is a diagram showing a state in which the tongue portion 52 inserted into the clip portion 61 is deviated maximally in an upper direction.

In view of this, a distance H1 from a lowermost end 52a of the tongue portion 52 to a point of contact (the fourth bending piece 84) by the clip portion 61 is set to be larger than the distance H2 from the upper end of the reinforcing plate 1001 to the bottom surface 22a of the rear case 22 at the time of assembling the housing 10 (i.e., in a state in which the tongue portion 52 is completely inserted into the opening 62) (i.e., H1>H2). With that setting, even if the tongue portion 52 is deviated in the upper direction, a position at which the upper end of the reinforcing plate 1001 is held in contact with the bottom surface 22a of the rear case 22 becomes an upper limit of deviation as shown in FIG. 16. At this upper-limit position, the distance from the lowermost end 52a of the tongue portion 52 to the point of contact by the clip portion 61 is shortened to be H1-H2 (>0). Meanwhile, a lower end of the tongue portion 52 still projects from the leading end of the clip portion 61. The state in which it is sandwiched by the clip portion 61 and the state in which it is held in contact by the clip portion 61 are maintained. Therefore, it is possible to prevent the tongue portion 52 from falling out of the clip portion 61 and to maintain the electrical connection between the clip portion 61 and the tongue portion 52.

Figure 17:
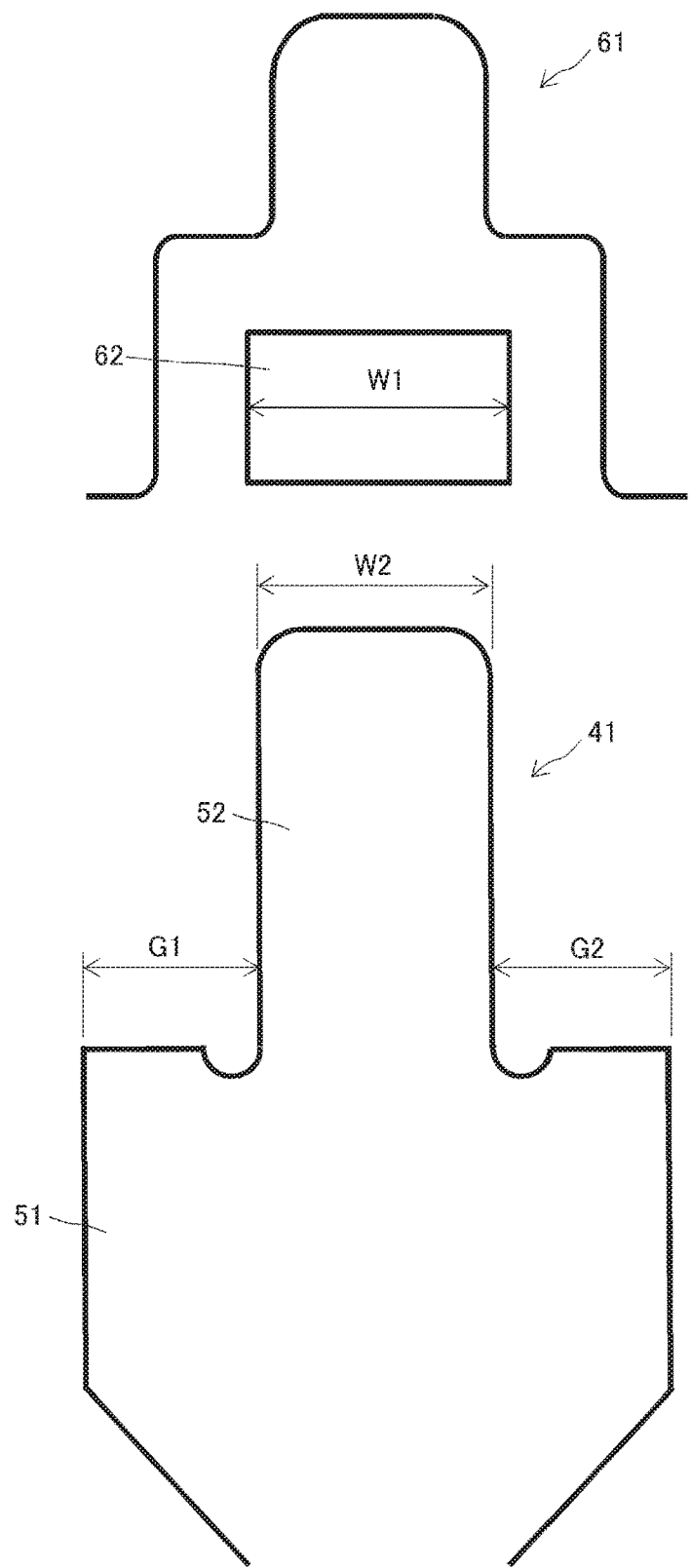
FIG. 17 is a diagram showing shape and dimension comparison between the tongue portion 52 and the clip portion 61.

Subsequently, influences of vibration of the vehicle in a horizontal direction will be considered. FIG. 17 shows shape and dimension comparison between the tongue portion 52 of the leading end of the FPC extension portion 41 and the clip portion 61 that sandwiches this tongue portion 52.

Figure 18:
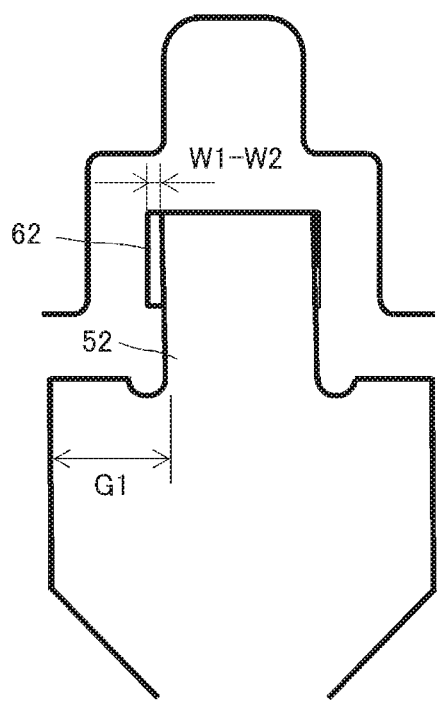
FIG. 18 is a diagram showing a state in which the tongue portion 52 is deviated in a right-hand direction in relation to an opening 62 of the clip portion 61.
Figure 19:
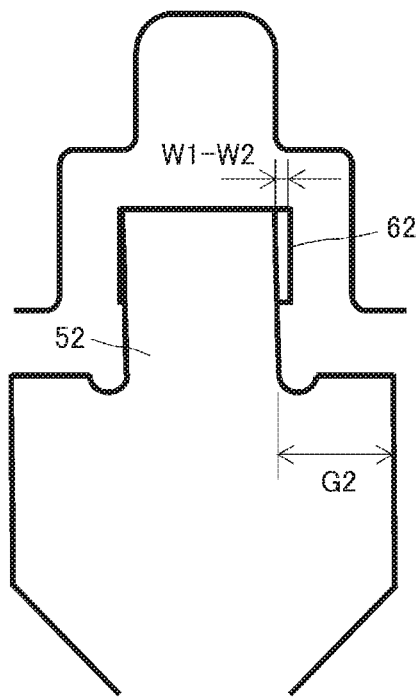
FIG. 19 is a diagram showing a state in which the tongue portion. 52 is deviated in a left-hand direction in relation to the opening 62 of the clip portion 61.

Provided that the width of the opening 62 formed in the clip portion 61 is denoted by W1 and the width of the tongue portion 52 is denoted by W2, the tongue portion 52 is assumed to be deviated by maximally W1-W2 in each of left- and right-hand directions (where W1>W2). Here, provided that a gap from a left end edge of the expanded portion 51 to a left end edge of the tongue portion 52 is denoted by G1 and a gap from a right end edge of the expanded portion 51 to a right end edge of the tongue portion 52 is denoted by G2, G1 and G2 are both set to be larger than W1-W2 (i.e., G1, G2>W1-W2). With that setting, as shown in FIGS. 18 and 19, even if the tongue portion 52 is deviated maximally in either the left- or right-hand direction through the opening 62, it is possible to prevent the tongue portion 52 from falling out of the clip portion 61 and to maintain the electrical connection by use of the clip portion 61.

INDUSTRIAL APPLICABILITY

The technology disclosed in the present specification has been described in detail with reference to the specific embodiment. However, it is obvious that those skilled in the art can make modifications and replacements of the embodiment without departing from the gist of technology disclosed in the present specification.

In the present specification, especially, the embodiment applied to the camera apparatus to be installed in the vehicle and used has been mainly described. However, applications of the technology disclosed in the present specification are not limited to the vehicle-mounted camera. The technology disclosed in the present specification can be applied not only to the vehicle-mounted camera but also to cameras to be installed is various movable apparatuses such as a watercraft, an aircraft, and a moving robot and utilized in an environment where vibration frequently occurs.

Further, the technology disclosed in the present specification can also be similarly applied to various types of electronic apparatuses to be utilized in an environment where vibration frequently occurs other than the camera apparatuses. As a matter of course, the ground reinforcing effect can also be obtained by applying the technology disclosed in the present specification to the electronic apparatus to be utilized in an environment where vibration does not frequently occur.

That is, the technology disclosed in the present specification has been described for illustrative purposes only and the contents described in the present specification should not be exclusively understood. In order to determine the gist of the technology disclosed in the present specification, the scope of claims should be taken into consideration.

It should be noted that the technology disclosed in the present specification can also take the following configurations.

(1) An electronic apparatus, including:
a board provided inside a housing and including a circuit component mounted on the board;
a shield chassis that covers a circumference of the board; and
a flexible printed circuit that electrically connects the board and the shield chassis to each other, in which
the shield chassis includes a sandwiching portion that sandwiches the flexible printed circuit, the sandwiching portion being formed integrally with the shield chassis.

(2) The electronic apparatus according to (1), in which
the flexible printed circuit includes a signal line pattern portion that electrically connects to a ground pattern portion of the board, and
the sandwiching portion sandwiches the flexible printed circuit to be held in contact with the signal line pattern portion.

(3) The electronic apparatus according to (1), in which
the sandwiching portion includes a clip portion formed by bending a projection formed at an upper end edge of a wall surface of the shield chassis and sandwiches the flexible printed circuit by use of the clip portion.

(4) The electronic apparatus according to (3), in which
the clip portion includes an opening in an upper surface and sandwiches an end portion of the flexible printed circuit inserted through the opening.

(5) The electronic apparatus according to (4), in which
the flexible printed circuit includes a tongue portion smaller than a width of the opening provided protruding from an expanded portion larger than the width of the opening and is sandwiched by the clip portion in such a manner that the tongue portion is inserted through the opening.

(6) The electronic apparatus according to (5), in which
the tongue portion is formed to be longer than the clip portion.

(7) The electronic apparatus according to (4), further including
a reinforcing plate superimposed on a vicinity of the end portion of the flexible board, in which
the clip portion sandwiches the end portion of the flexible printed circuit together with the reinforcing plate.

(8) The electronic apparatus according to (4), in which
the opening has a stepped structure in which an end edge on a root side (on a side closer to the wall surface of the shield chassis) is formed to be higher than an end edge on a side closer to a leading end of the clip portion.

(9) The electronic apparatus according to (7), in which
a distance from a point of contact between the clip portion and the flexible printed circuit to a lower end of the reinforcing plate is larger than a clearance between an upper end of the reinforcing plate and an inner wall of the housing.

(10) The electronic apparatus according to (5), in which
a difference between the width of the opening and a width of the tongue portion is smaller than a gap between an end edge of the tongue portion and an end edge of the expanded portion.

(11) A camera apparatus, including:
a shield chassis that covers a circumference of the board; and
a flexible printed circuit that electrically connects the board and the shield chassis to each other, in which
the shield chassis includes a sandwiching portion that sandwiches the flexible printed circuit, the sandwiching portion being formed integrally with the shield chassis.

(12) A shield chassis that covers a circumference of a board inside an electronic apparatus and includes a sandwiching portion that sandwiches a flexible printed circuit connected to the board, the sandwiching portion being formed integrally with the shield chassis.

REFERENCE SIGNS LIST 1 camera apparatus, 10 housing
11 lens barrel, 12 image pickup lens
14 image pickup element, 15 image pickup mechanism,
16 shield chassis
20 front case, 21 rear case
22 lens opening, 23 cylindrical portion, 24 front-case main body
25 connector, 26 barrel portion, 27 flange portion
28a, 28b connection block
31 board, 33 circuit chip, 36 flexible printed circuit
39 connector connection portion, 40 terminal portion, 41 FPC extension portion
51 expanded portion, 52 tongue portion
61 clip portion, opening 62
100 vehicle-mounted camera system
101 front-view camera, 102 rear-view camera
103, 104 side-view camera
105 cabin-view camera
111 front-view camera ECU
112 rear-view camera ECU
113, 114 side-view camera ECU
120 image composition ECU, 130 shift lever
140 display

The invention claimed is:

1. An electronic apparatus, comprising:
a board provided inside a housing and including a circuit component mounted on the board;
a shield chassis that covers a circumference of the board; and
a flexible printed circuit that electrically connects the board and the shield chassis to each other,
wherein the shield chassis includes a sandwiching portion having a clip portion that sandwiches the flexible printed circuit,
wherein the sandwiching portion is formed integrally with the shield chassis, wherein the clip portion includes an opening through which the flexible printed circuit is inserted, and wherein the opening has a stepped structure in which an end edge of the opening on a side closer to a wall surface of the shield chassis is formed to be higher than an end edge of the opening on a side closer to a leading end of the clip portion.

2. The electronic apparatus according to claim 1, wherein the flexible printed circuit includes a signal line pattern portion that electrically connects to the board, and wherein the sandwiching portion sandwiches the flexible printed circuit to be held in contact with the signal line pattern portion.

3. The electronic apparatus according to claim 1, wherein the clip portion is formed by bending a projection formed at an upper end edge of a wall surface of the shield chassis.

4. The electronic apparatus according to claim 3, wherein the clip portion includes the opening in an upper surface of the clip portion, and wherein the clip portion sandwiches an end portion of the flexible printed circuit that is inserted through the opening.

5. The electronic apparatus according to claim 4, wherein the flexible printed circuit includes a tongue portion smaller than a width of the opening provided protruding from an expanded portion larger than the width of the opening and is sandwiched by the clip portion in such a manner that the tongue portion is inserted through the opening.

6. The electronic apparatus according to claim 4, further comprising a reinforcing plate superimposed on a vicinity of the end portion of the flexible board, wherein the clip portion sandwiches the end portion of the flexible printed circuit together with the reinforcing plate.

7. The electronic apparatus according to claim 5, wherein the tongue portion is formed to be longer than the clip portion.

8. The electronic apparatus according to claim 5, wherein a difference between the width of the opening and a width of the tongue portion is smaller than a gap between an end edge of the tongue portion and an end edge of the expanded portion.

9. The electronic apparatus according to claim 6, wherein a distance from a point of contact between the clip portion and the flexible printed circuit to a lower end of the reinforcing plate is larger than a clearance between an upper end of the reinforcing plate and an inner wall of the housing.

10. A camera apparatus, comprising:

a shield chassis that covers a circumference of a board; and a flexible printed circuit that electrically connects the board and the shield chassis to each other, wherein the shield chassis includes a sandwiching portion having a clip portion that sandwiches the flexible printed circuit, wherein the sandwiching portion is formed integrally with the shield chassis, wherein the clip portion includes an opening through which the flexible printed circuit is inserted, and wherein the opening has a stepped structure in which an end edge of the opening on a side closer to a wall surface of the shield chassis is formed to be higher than an end edge of the opening on a side closer to a leading end of the clip portion.

11. A shield chassis configured to cover a circumference of a board inside an electronic apparatus, the shield chassis comprising:

a sandwiching portion having a clip portion that sandwiches a flexible printed circuit connected to the board, wherein the sandwiching portion is formed integrally with the shield chassis, wherein the clip portion includes an opening through which the flexible printed circuit is inserted, and wherein the opening has a stepped structure in which an end edge of the opening on a side closer to a wall surface of the shield chassis is formed to be higher than an end edge of the opening on a side closer to a leading end of the clip portion.

\* \* \* \* \*